United States Patent
Fukuda

[11] Patent Number: 6,166,775
[45] Date of Patent: Dec. 26, 2000

[54] VIDEO SIGNAL SAMPLING CIRCUIT AND AN IMAGE DISPLAY APPARATUS INCLUDING THE SAME

[75] Inventor: Hisatoshi Fukuda, Atsugi, Japan

[73] Assignee: Victor Company of Japan, Ltd., Yokohama, Japan

[21] Appl. No.: 09/146,074

[22] Filed: Sep. 2, 1998

[30] Foreign Application Priority Data

Sep. 3, 1997 [JP] Japan ................................ 9-254213

[51] Int. Cl.[7] ....................................................... H04L 7/00
[52] U.S. Cl. ......................................... 348/537; 348/572
[58] Field of Search .................................. 348/501, 502, 348/505, 536, 537, 539, 540, 541, 542, 572, 575, 552

[56] References Cited

U.S. PATENT DOCUMENTS

| | | | |
|---|---|---|---|
| 4,757,264 | 7/1988 | Lee et al. ................................ | 348/537 |
| 4,943,857 | 7/1990 | Izuno et al. ............................. | 348/537 |
| 5,396,295 | 3/1995 | Furuta ..................................... | 348/537 |
| 5,528,307 | 6/1996 | Owada et al. .......................... | 348/537 |
| 5,539,473 | 7/1996 | Kommrusch et al. ................. | 348/537 |
| 5,731,843 | 3/1998 | Cappels, Sr. ........................... | 348/537 |

*Primary Examiner*—Michael Lee
*Assistant Examiner*—Trang U. Tran
*Attorney, Agent, or Firm*—Pollock, Vande Sande & Amernick

[57] ABSTRACT

A video signal sampling circuit searches the optimum sampling frequency and phase of the sampling clock signal by detecting level changing points in the sampled video signal in the horizontal direction with the sampling frequency varied every predetermined phase. The saturated maximum count of the level changing point provides the optimum sampling frequency and optimum phase of the sampling clock signal. The video signal sampling circuit automatically sets the optimum sampling frequency and phase of the sampling clock signal in accordance with the result of searching. The video display including the video signal sampling circuit is also disclosed.

7 Claims, 4 Drawing Sheets

FIG. 4A PRIOR ART SORG

FIG. 4B PRIOR ART CLS 1

FIG. 4C PRIOR ART SS 1

FIG. 4D PRIOR ART CLS 2

FIG. 4E PRIOR ART SS 2

FIG. 4F PRIOR ART CLS 0

FIG. 4G PRIOR ART SS 0

VIDEO SIGNAL SAMPLING CIRCUIT AND AN IMAGE DISPLAY APPARATUS INCLUDING THE SAME

BACKGROUND OF THE INVENTION

1. Field of the Invention

This invention relates to a video signal sampling circuit and an image display apparatus including the same.

2. Description of the Prior Art

A video signal sampling circuit for generating a sampling clock signal and sampling a video signal in response to the sampling clock, and outputting the sampled video signal is known. In such a video signal sampling circuit, the frequency and the phase of the sampling clock signal are manually adjusted because vertical and horizontal resolutions of the video signal are respectively different in accordance with the kind of the inputted video signal.

The video signal is supplied from a personal computer and the sampled video signal is supplied to an image display apparatus such as a video projector including a light source and a liquid crystal light valve unit to display an image in accordance with the sampled video signal.

There are variable standards for video signals from personal computers (PC video signal) in which resolutions are different. For example, the VGA signal has resolutions of horizontal 640 pixels×vertical 480 pixels, the SVGA signal has resolutions of horizontal 800 pixels×vertical 600 pixels, and the XGA signal has resolutions of horizontal 1024 pixels×vertical 768 pixels. Moreover, there are the same VGA signal or the same SVGA signal having slightly different horizontal synchronizing frequencies.

FIGS. 4A to 4G show prior art waveforms of PC video signal to be sampled, sampling clock signals, and sampled video signals.

As shown in FIGS. 4A and 4B, the PC video signal SORG is sampled by the sampling clock signal CLS1 of which frequency is lower than the sampling clock signal used for generating the PC video signal. The sampled PC video signal SS1 is distorted as shown in FIG. 4C.

If a frequency of the sampling clock signal is higher than that of the sampling clock signal used for generating the PC video signal as shown in FIG. 4D, the sampled PC video signal SS2 may have a distortion also, as shown in FIG. 4F. Moreover, the waveform of the sampled PC video signal varies with the phase of the sampling clock signal from the horizontal synchronizing.

When a sampling clock signal CLS0 having substantially the same frequency as the sampling clock signal used for generating the PC video signal is used as shown in FIG. 4F, wherein the phase of the PC sampling clock signal CLS0 is suitably adjusted, the sampled PC video signal SS0 in FIG. 4G shows substantially the same waveform as the PC video signal SORG in FIG. 4A.

SUMMARY OF THE INVENTION

The aim of the present invention is to provide a superior video signal sampling circuit and a superior image display apparatus.

According to the present invention there is provided a video signal sampling circuit including: a sampling clock signal generation circuit responsive to a horizontal synchronizing signal of a video signal for generating a sampling clock signal of which frequency and phase to the horizontal synchronizing signal are respectively controlled in accordance with frequency control data and phase control data; a sampling circuit for sampling the video signal in response to the sampling clock signal; a changing point detection circuit for detecting level changing points in the sampled video signal; a counting circuit for counting the changing points for a predetermined interval; and a control circuit responsive to a command signal for detecting saturated maximum count value of the counting circuit with the frequency control data and the phase control data successively changed, determining values of the frequency control data and the phase control data at the saturated maximum count value, and continuously supplying the determined frequency control data and the determined phase control data to the sampling clock signal generation circuit.

The video signal sampling circuit may further include a detection circuit responsive to the horizontal synchronizing signal and a vertical synchronizing signal of the video signal for detecting the number of pixels in the video signal in the vertical direction, wherein the control circuit further determines a range of the frequency control data in accordance with the detected number of pixels and successively changes the frequency control data within the range to detect the saturated maximum count value of the counting circuit.

In the video signal sampling circuit, the counting circuit may count the level changing points every frame in response to the vertical synchronizing signal of the video signal.

In the video signal sampling circuit, the changing point detection circuit may comprise a line memory for storing the level changing points every line of the video signal through OR operation between the lines.

In the video signal sampling circuit, the sampling circuit may include an a/d converter.

In the video signal sampling circuit, the changing point detection circuit may include a comparator for comparing the sampled video signal with a reference and the changing point detection circuit detects the level changing points in the output of the comparator.

In the video signal sampling circuit, the video signal may include red, green, and blue signals and the changing point detection circuit may include first to third changing point detection circuits responsive to the red, green, and blue signals, an OR gate for effecting OR operation among outputs of the first to third changing point detection circuits, and a line memory responsive to a vertical synchronizing signal for storing the changing points from the OR gate every line of the video signal through OR operation between the lines.

According to the present invention there is also provided an image display apparatus including: a sampling clock signal generation circuit responsive to a horizontal synchronizing signal of a video signal for generating a sampling clock signal of which a frequency and phase to the horizontal synchronizing signal are respectively controlled in accordance with frequency control data and phase control data; a sampling circuit for sampling the video signal in response to the sampling clock signal; a changing point detection circuit for detecting level changing points in the sampled video signal; a counting circuit for counting the level changing points for a predetermined interval; a control circuit responsive to a command signal for detecting saturated maximum count value of the counting circuit with the frequency control data and the phase control data successively changed, determining values of the frequency control data and the phase control data at the saturated maximum count value, and continuously supplying the determined frequency control data and the determined phase control data to the sampling clock signal generation circuit; a display processing circuit for processing the sampled video signal; and a display for displaying an image in response to an output of the display processing circuit.

BRIEF DESCRIPTION OF THE DRAWINGS

The object and features of the present invention will become more readily apparent from the following detailed description taken in conjunction with the accompanying drawings in which:

FIGS. 4A to 4G show prior art waveforms of PC video signal to be sampled, sampling clock signals, and sampled video signals.

The same or corresponding elements or parts are designated with like references throughout the drawings.

DETAILED DESCRIPTION OF THE INVENTION

Figure 1:
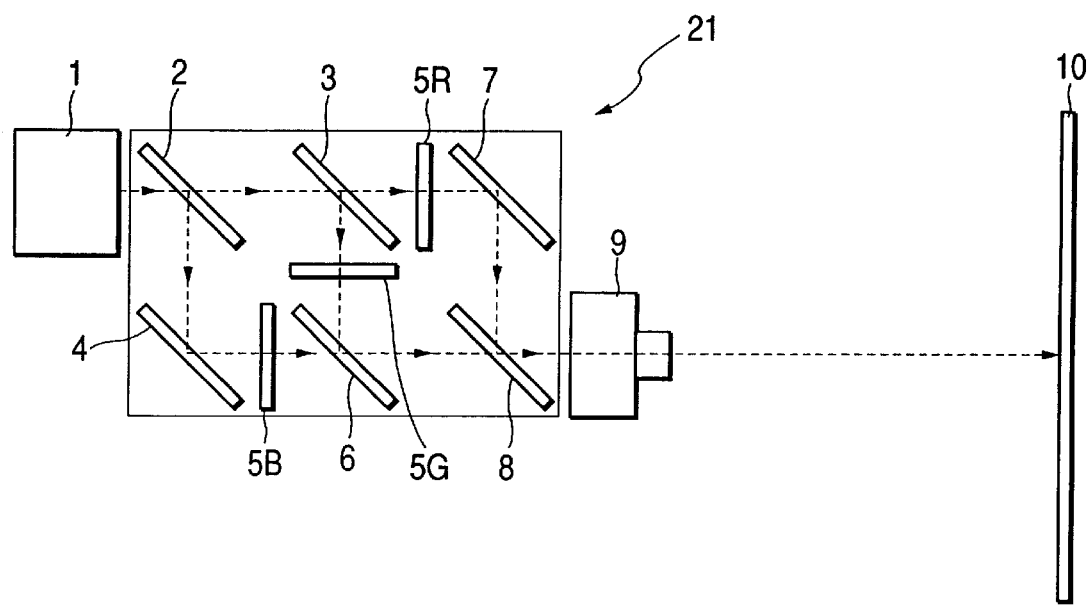
FIG. 1 is a side view, partially cross-sectional side view, of an optical system of a display of a video projector of an embodiment of this invention.
Figure 2:
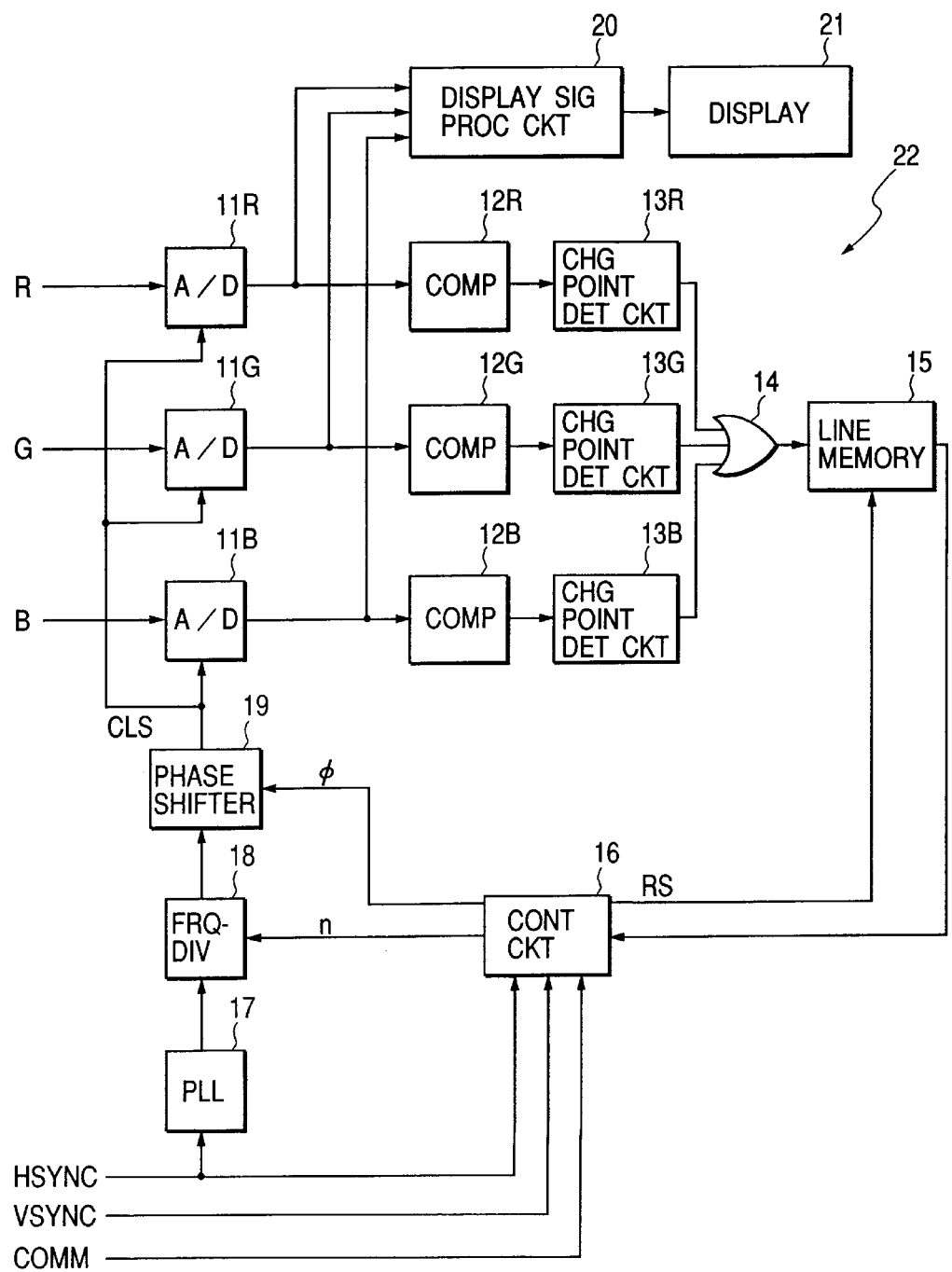
FIG. 2 is a block diagram of of the video projector of the embodiment.

FIG. 1 is a side view, partially cross-sectional side view, of an optical system of a display of a video projector of the embodiment of this invention. FIG. 2 is a block diagram of the video projector of this embodiment.

The display 21 includes a light source 1 for emitting light, dichroic mirrors 2, 3, 6, and 8, total reflection mirrors 4 and 7, liquid crystal light valve units 5R, 5G, and 5B, and a project lens unit 9 having a zoom system.

The light source 1 emits light. The dichroic mirror 2 reflects blue light and transmits remaining light components therethrough. The blue light from the dichroic mirror 2 is reflected by the total reflection mirror 4 and enters the liquid crystal light valve unit 5B. The liquid crystal light valve unit 5B forms a blue image beam by two-dimensionally light intensity modulating by controlling every liquid crystal elements of the liquid crystal light valve unit 5B in accordance with a blue display control signal from a display signal processing circuit 20 shown in FIG. 2 and emits the blue image beam toward the project lens unit 9. The remaining light components from the dichroic mirror 2 is separated by the dichroic mirror 3 into green light and red light. More specifically, the green light is reflected and directed by the dichroic mirror 3 to the dichroic mirror 6 through the liquid crystal light valve unit 5G. The liquid crystal light valve unit 5G forms a green image beam in accordance with a green display control signal from the display signal processing circuit 20 shown in FIG. 2 and emits the green image beam toward the dichroic mirror 6. The red light from the dichroic mirror 3 enters the liquid crystal light valve unit 5R. The liquid crystal light valve unit 5R forms a red image beam in accordance with a red display control signal from the display signal processing circuit 20 and emits the red image beam toward the dichroic mirror 8. The dichroic mirrors 6 and 8 combine the blue image beam, the green image beam, and red image beam and emit the combined beams as a color image beam toward a screen 10. The project lens unit 9 focus the color image beam on the screen 10 to form a color image on the screen 10.

The video signal sampling circuit 22, as shown in FIG. 2, includes a/d converters 11R, 11G, and 11B for respectively sampling red, green, and blue signals R, G, and B in response to a sampling clock signal CLS and converting the red, green, and blue signals R, G, and B into a digital red signal, a digital green signal, and a digital blue signal, comparators 12R, 12G, and 12B for comparing the digital red signal, the digital green signal, and the digital blue signal with a reference (threshold value LTH) to generate binary red, green, and blue signals respectively, changing point detection circuits 13R, 13G, and 13B for respectively detecting level changing points in the binary red, green, and blue signals, an OR gate 14 for effecting OR operation among outputs of the changing point detection circuits 13R, 13G, and 13B, a line memory 15 for storing one horizontal line of the output of the OR gate 14, a PLL 17 for generating a frequency signal in response to a horizontal synchronizing signal HSYNC, a frequency divider 18 for frequency-dividing the frequency signal to generate the sampling clock signal in accordance with a frequency dividing number n, that is, frequency control data, a phase shifter 19 for shifting a phase of the sampling clock signal from the frequency divider 18 in accordance with phase control data $\phi$ and generating the sampling clock signal CLS, and a control circuit (microprocessor) 16 for generating the frequency control data n and the phase control data $\phi$ in accordance with the output of the line memory 15.

The a/d converters 11R, 11G, and 11B sample the red, green, and blue signals R, G, and B in response to the sampling clock signal CLS and converts the red, green, and blue signals R, G, and B into the digital red, the digital green, and the digital blue signal. The comparators 12R, 12G, and 12B compare the digital red, the digital green, and the digital blue signal with the reference to generate binary red, green, and blue signals respectively. The changing point detection circuit 13R, 13G, and 13B respectively detect level changing points in the binary red signal, the binary green signal, and binary blue signal.

Each of the changing point detection circuits detects the changing point by comparing the present pixel level of the binary color signal with the level of the binary signal at one-horizontal-prior pixel.

The OR gate 14 effects OR operation among outputs of the changing point detection circuits 13R, 13G, and 13B. The line memory 15 stores each line of the output of the OR gate 14 and is reset by a reset signal RS generated from the vertical synchronizing signal VSYNC by the control circuit 16, that is, "0" is stored in the line memory 15 in response to the reset signal RS. In the line memory 15, the level changing points are stored through OR operation between lines in the frame without overlapping. That is, if "1" indicative of the level changing point is stored more than one at the same address of the line memory 15, the value at this address remains "1".

The control circuit 16 comprising a microprocessor counts the level changing points in the output of the line memory 15 and generates the frequency control data n and the phase control data $\phi$ in accordance with the count of the level changing points in response to a command signal COMM in accordance with the program stored in the microprocessor mentioned later.

The PLL 17 generates the frequency signal in response to the horizontal synchronizing signal HSYNC. The frequency divider 18 frequency-divides the frequency signal to generate the sampling clock in accordance with the frequency dividing number n, that is, frequency control data. The phase shifter 19 shifts the phase of the sampling clock signal from the frequency divider 18 in accordance with phase control data φ and supplies the sampling clock signal CLS to the a/d converters 11R, 11G, and 11B.

Figure 3:
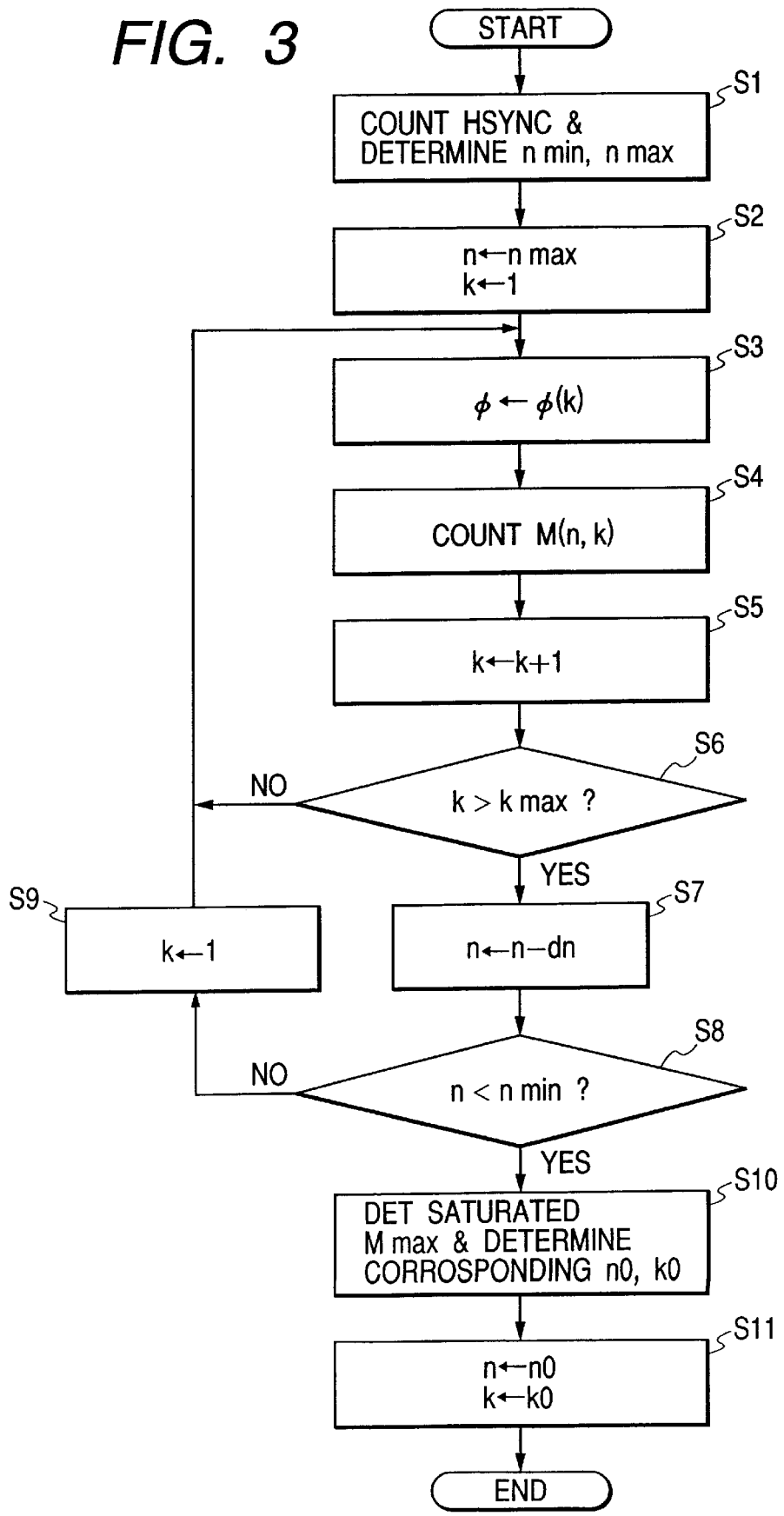
FIG. 3 depicts a flow chart of this embodiment showing the optimum sampling condition searching operation.

FIG. 3 depicts a flow chart showing the optimum sampling condition searching operation of the microprocessor 16.

The optimum sampling condition searching operation is started in response to the command signal COMM which is generated by operating a switch (not shown) by a user for example and the video signal (red, green, and blue signal) representing a still picture image, for example, a menu selection image, is inputted to the a/d converters 11R, 11G, and 11B from a personal computer (not shown).

The microprocessor 16 counts the horizontal synchronizing signal HSYNC in response to the vertical synchronizing signal VSYNC to detect the number of scanning lines in one frame. That is, the microprocessor 16 detects the number of pixels in the vertical direction of one frame and then, Judges the kind of the inputted video signal in accordance with the detected number of pixels in the vertical direction. More specifically, the microprocessor 16 classifies the inputted video signal into the video signal of the VGA signal (horizontal 800–864 pixels×vertical 500–525 pixels), the SVGA signal (horizontal 1024–1152×vertical 625–667), the XGA signal (horizontal 1264–1456×vertical 800–915), and the SXGA signal (horizontal 1688×vertical 1066). Then, the microprocessor 16 determines the search range of the frequency control data (dividing ratio) n, that is, determines the minimum of n (n min) and the maximum of n (n max) in accordance with the classifying result. The minimum of n is determined to be slightly lower than the search range of the classified video signal and the maximum of n is determined to be slightly higher than the search range of the classified video signal.

In the following step S2, the microprocessor 16 sets n max to the frequency control data n in a memory thereof (not shown) and supplies it to the frequency divider 18 and sets "1" to a parameter k for controlling the phase φ. For example, the phase φ is successively varied every set of the level changing points in the range of frequency control data, for example, the phase φ is changed from 0, 36, 72, - - - , and 326 degrees in step S9 mentioned later.

In the following step S3, the microprocessor 16 sets φ (k) to the phase control data and counts the value "1" in the output of the line memory 15 for one frame and stores the count value M (n, k). That is, the microprocessor 16 counts the level changing points in any of binary red, green, and blue signals every frame in step S4. In the line memory 15, if there are more than one changing points in the same horizontal address of the line memory 15 in one frame, the microprocessor 16 counts the changing point at this address by one. Then, the microprocessor 16 supplies the reset signal RS to the line memory 15 in response to the vertical synchronizing signal VSYNC.

In step S5, the microprocessor 16 increases k by one and repeats the processing from step S3 to S5 until k>k max (for example 10) in step S6. If the k>k max in step S6, that is, the series of phase changing has finished, the microprocessor 16 decreases n by a predetermined value dn, for example 8, from the present n and sets the result to n in step S7. The microprocessor 16 repeats the steps S3 to S7 until n<n min. More specifically, if n is not lower than n min in step S8, the microprocessor 16 sets "1" to k in step S9 and returns to step S3.

If n<n min in step S8, the microprocessor detects the maximum M MAX from stored count values M (n, K), i.e., the maximum M (n, k)=MMAX. The microprocessor 16 selects the set of counts of level changing points showing the maximum n and minimum k to determine the dividing ratio n0 and parameter k0 for the saturated maximum value MMAX. The microprocessor 16 sets the n0 and k0 to the dividing ratio n (frequency control data) and to parameter k (phase control data) in step S11 and ends this processing.

In order to detect the suitable sampling frequency, this invention utilizes the fact that if the sampling frequency is lower than the frequency used for generating the video signal, the number of the level changing points in the sampled video signal in the horizontal direction is lower than that of the original video signal and if the sampling frequency is increased, the number of the level changing points in the sampled video signal increases and saturates when the number of changing points in the sampled video signal is equal to that of the original video signal. The optimum sampling condition searching operation shown in FIG. 3 searches the optimum sampling frequency by using this fact.

In this invention, counting the level changing points is effected every frame. However, it is also possible that the number of the changing points are counted for one horizontal scanning period if the video signal represents an image including vertical stripes which shows a high vertical correlation.

Moreover, if the video signal showing a high horizontal correlation is used, it is also possible that the number of the changing points are counted for a predetermined period within one horizontal scanning period. On the other hand, it is undesirable that the video signal showing few changing points, for example, the video signal representing one vertical bar in one frame, is used for searching the optimum sampling frequency.

In the above-mentioned embodiment, detecting the changing points is effected to binary video data provided by the comparators 12R, 12G, and 12B. However, it is also possible to provide data of the level changing points by detecting a changing point at which a value of the sampled video signal changes more than a predetermined value. In this embodiment, to simplify the level changing point detection circuits 13R, 13G, and 13B, the binary video data (binary red, green, and blue signals) is used for detecting the changing point.

Moreover, in this embodiment, the display 21 is a video projector. However, the sampling circuit of this embodiment is applicable to a usual liquid crystal display for video displaying and a CRT display and other display including two-dimensionally arranged pixels.

As mentioned, the video signal sampling circuit of this invention searches the optimum sampling frequency and phase of the sampling clock signal by detecting level changing points in the sampled video signal in the horizontal direction with the sampling frequency varied every predetermined phase to the horizontal synchronizing signal. The saturated maximum count of the level changing point provides the optimum sampling frequency and optimum phase of the sampling clock signal. The video signal sampling circuit automatically sets the optimum sampling frequency and phase of the sampling clock signal in accordance with the result of searching.

What is claimed is:

1. A video signal sampling circuit comprising:
   sampling clock signal generation means responsive to a horizontal synchronizing signal of a video signal for generating a sampling clock signal of which a frequency and phase to said horizontal synchronizing signal are respectively controlled in accordance with frequency control data and phase control data;
   sampling means for sampling said video signal in response to said sampling clock signal and outputting the sampled video signal;
   changing point detection means for detecting level changing points in the sampled video signal;

counting means for counting said changing points for a predetermined interval;

control means responsive to a command signal for detecting saturated maximum count value of said counting means with said frequency control data and said phase control data successively changed, determining values of said frequency control data and said phase control data at said saturated maximum count value, and continuously supplying the determined frequency control data and the determined phase control data to said sampling clock signal generation means; and detection means responsive to said horizontal synchronizing signal and a vertical synchronizing signal of said video signal for detecting the number of pixels of said video signal in the vertical direction, wherein said control means further determines a range of said frequency control data in accordance with the detected number of pixels and successively changes said frequency control data within said range to detect said saturated maximum count value of said counting means.

2. The video signal sampling circuit as claimed in claim 1, wherein said changing point detection means comprises a line memory for storing said level changing points every line of said video signal through an OR operation between said lines.

3. A video signal sampling circuit as claimed in claim 1, wherein said video signal includes color signals, said sampling means samples said color signals in response to the sampling signal and outputs sampled color signals, said changing point detection means detects level changing points of the sampled color signals, said changing point detection means further comprises OR operation means for effecting an OR operation among detected level changing points of the sampled color signals at the same horizontal positions for the same horizontal scanning period, and said counting means counts said changing points from an output of said OR operation means for said horizontal scanning period as said predetermined interval.

4. A video signal sampling circuit comprising:

sampling clock signal generation means responsive to a horizontal synchronizing signal of a video signal for generating a sampling clock signal of which a frequency and phase to said horizontal synchronizing signal are respectively controlled in accordance with frequency control data and phase control data;

sampling means for sampling said video signal in response to said sampling clock signal and outputting the sampled video signal;

changing point detection means for detecting level changing points in the sampled video signal;

counting means for counting said changing points for a predetermined interval wherein said counting means counts said level changing points every frame in response to a vertical synchronizing signal of said video signal; and control means responsive to a command signal for detecting saturated maximum count value of said counting means with said frequency control data and said phase control data successively changed, determining values of said frequency control data and said phase control data at said saturated maximum count value, and continuously supplying the determined frequency control data and the determined phase control data to said sampling clock signal generation means.

5. The video signal sampling circuit as claimed in claim 4, wherein said changing point detection means comprises a line memory for storing said level changing points every line of said video signal through an OR operation between said lines.

6. A video signal sampling circuit comprising:

sampling clock signal generation means responsive to a horizontal synchronizing signal of a video signal for generating a sampling clock signal of which a frequency and phase to said horizontal synchronizing signal are respectively controlled in accordance with frequency control data and phase control data;

sampling means for sampling said video signal in response to said sampling clock signal and outputting the sampled video signal;

changing point detection means for detecting level changing points in the sampled video signal wherein said changing point detection means comprises a line memory for storing said level changing points every line of said video signal through an OR operation between said lines;

counting means for counting said changing points for a predetermined interval; and control means responsive to a command signal for detecting saturated maximum count value of said counting means with said frequency control data and said phase control data successively changed, determining values of said frequency control data and said phase control data at said saturated maximum count value, and continuously supplying the determined frequency control data and the determined phase control data to said sampling clock signal generation means.

7. A video signal sampling circuit comprising:

sampling clock signal generation means responsive to a horizontal synchronizing signal of a video signal for generating a sampling clock signal of which a frequency and phase to said horizontal synchronizing signal are respectively controlled in accordance with frequency control data and phase control data;

sampling means for sampling said video signal in response to said sampling clock signal and outputting the sampled video signal;

changing point detection means for detecting level changing points in the sampled video signal, said changing point detection means comprising first to third changing point detection circuits responsive to red, green, and blue signals included in said video signal, an OR gate for effecting an OR operation among outputs of said first to third changing point detection circuits, and a line memory responsive to a vertical synchronizing signal for storing said level changing points from said OR gate every line of said video signal through an OR operation between said lines;

counting means for counting said changing points for a predetermined interval; and control means responsive to a command signal for detecting saturated maximum count value of said counting means with said frequency control data and said phase control data successively changed, determining values of said frequency control data and said phase control data at said saturated maximum count value, and continuously supplying the determined frequency control data and the determined phase control data to said sampling clock signal generation means.

* * * * *